(12) United States Patent
Nergis

(10) Patent No.: US 7,535,311 B2
(45) Date of Patent: May 19, 2009

(54) DIRECT WIDEBAND MODULATION OF A FREQUENCY SYNTHESIZER

(75) Inventor: Aydin Nergis, San Diego, CA (US)

(73) Assignee: Infineon Technologies AG, Munich (DE)

( * ) Notice: Subject to any disclaimer, the term of this patent is extended or adjusted under 35 U.S.C. 154(b) by 86 days.

(21) Appl. No.: 11/564,892

(22) Filed: Nov. 30, 2006

(65) Prior Publication Data

US 2008/0129406 A1   Jun. 5, 2008

(51) Int. Cl.
H04C 3/08 (2006.01)
H04C 3/09 (2006.01)

(52) U.S. Cl. .................. 332/127; 455/126

(58) Field of Classification Search .......... 332/127, 332/128; 455/126
See application file for complete search history.

(56) References Cited

U.S. PATENT DOCUMENTS

| | | | |
|---|---|---|---|
| 5,111,162 A | 5/1992 | Hietala et al. | |
| 5,706,310 A * | 1/1998 | Wang et al. ............. | 375/296 |
| 5,825,257 A | 10/1998 | Klymyshyn et al. | |
| 5,834,985 A | 11/1998 | Sundegard | |
| 5,995,812 A | 11/1999 | Soleimani et al. | |
| 6,008,703 A | 12/1999 | Perrott et al. | |
| 6,011,815 A | 1/2000 | Eriksson et al. | |
| 6,047,029 A | 4/2000 | Eriksson et al. | |
| 6,097,765 A | 8/2000 | Corrigan, III et al. | |
| 6,122,326 A | 9/2000 | Jackson et al. | |
| 6,281,935 B1 * | 8/2001 | Twitchell et al. ............ | 348/470 |
| 6,345,173 B1 | 2/2002 | Fourtet et al. | |
| 6,356,597 B1 | 3/2002 | Jackson et al. | |
| 6,366,620 B1 | 4/2002 | Jackson et al. | |
| 6,370,204 B1 | 4/2002 | Solcimani et al. | |
| 6,418,174 B1 | 7/2002 | Benedict | |
| 6,420,940 B1 | 7/2002 | Minnis et al. | |
| 6,526,265 B1 | 2/2003 | Damgaard et al. | |
| 6,671,337 B1 | 12/2003 | Cordoba | |
| 6,806,780 B2 | 10/2004 | Fontaine et al. | |
| 6,809,598 B1 | 10/2004 | Staszewski et al. | |
| 6,833,767 B1 | 12/2004 | Huff et al. | |
| 6,834,084 B2 | 12/2004 | Hietala | |
| 6,873,218 B2 | 3/2005 | Khlat | |
| 6,952,569 B2 | 10/2005 | Damgaard et al. | |
| 6,961,547 B2 | 11/2005 | Rozenblit et al. | |

OTHER PUBLICATIONS

Cho, SeongHwan et al. "A 6.5-GHz Energy-Efficient BFSK Modulator for Wireless Sensor Applications." IEEE Journal of Solid-State Circuits, vol. 39, No. 5, May 2004, pp. 731-739.

Filiol, Norman M. et al. "An Agile ISM Band Frequency Synthesizer with Built-In GMSK Data Modulation." IEEE Journal of Solid-State Circuits, vol. 33, No. 7, Jul. 1998, pp. 998-1008.

(Continued)

*Primary Examiner*—Robert Pascal
*Assistant Examiner*—James E Goodley
(74) *Attorney, Agent, or Firm*—Coats & Bennett, P.L.L.C.

(57) ABSTRACT

A frequency synthesizer modulates a signal by directly modulating a signal input to a voltage controlled oscillator (VCO) associated with the frequency synthesizer. The modulation signal has a bandwidth greater than a closed-loop bandwidth of the frequency synthesizer. The frequency synthesizer suppresses the modulation signal from a feedback path of the synthesizer.

24 Claims, 5 Drawing Sheets

OTHER PUBLICATIONS

Lam, Christopher et al. "A 2.6-GHz/5.2-GHz Frequency Synthesizer in 0.4-um CMOS Technology." IEEE Journal of Solid-State Circuits, vol. 35, No. 5, May 2000, pp. 788-794.

McMahill, Daniel R. et al. "Automatic Calibration of Modulated Sigma-Delta Frequency Synthesizers." 2001 Symposium on VLSI Circuits Digest of Technical Papers, pp. 51-54.

Perrott, Michael H. et al. "A 27-mW CMOS Fractional-N Synthesizer Using Digital Compensation for 2.5-Mb/s GFSK Modulation." IEEE Journal of Solid-State Circuits, vol. 32, No. 12, Dec. 1997, pp. 2048-2060.

Riley Tom A. D. et al. "Delta-Sigma Modulation in Fractional-N Frequency Synthesis." IEEE Journal of Solid-State Circuits, vol. 28, No. 5, May 1993, pp. 553-559.

Riley, Thomas A. D. et al. "A Simplified Continuous Phase Modulator Technique." IEEE Transactions on Circuits and Systems—II: Analog and Digital Signal Processing, vol. 41, No. 5, May 1994, pp. 321-328.

Zarei, Hossein et al. "A Low-Power Fully Integrated Gaussian-MSK Modulator Based on the Sigma-Delta Fractional-N Frequency Synthesis." 2001 IEEE International Symposium on Circuits and Systems, vol. 4, May 2001, pp. 100-103.

* cited by examiner

DIRECT WIDEBAND MODULATION OF A FREQUENCY SYNTHESIZER

BACKGROUND OF THE INVENTION

The present invention generally relates to frequency synthesizers, and particularly relates to performing direct wideband continuous phase and frequency modulation by a frequency synthesizer.

Wireless communication involves the use of radio waves to transmit data between devices and conventionally involves modulating or otherwise translating data signals to a suitable frequency for transmission. Quadrature modulation is one technique for modulating data signals. Data is conveyed using quadrature modulation by modulating the amplitude of two carrier waves in response to a data signal. The two carrier waves are approximately 90° out of phase with each other and are modulated or keyed to represent a data signal. Homodyne transmitter-based quadrature modulators comprise many components such as digital-to-analog converters and radio frequency mixers along with frequency synthesizers for generating a carrier frequency. The in-phase and quadrature signal paths of a quadrature modulator must be well matched in order to maintain acceptable signal quality.

Indirect and direct modulation of the frequency synthesizers overcome many of the limitations associated with quadrature modulators. A frequency synthesizer makes use of a Phase-Locked Loop (PLL) for performing frequency modulation. A phase comparator in a PLL compares frequencies (or phases) of two signals and produces an error signal that is proportional to the difference between the signal frequencies (or phases). The error signal, after low-pass filtering, drives a voltage-controlled oscillator (VCO), which changes its output frequency in response to the magnitude of the error signal. The VCO output is fed back to the input of the phase comparator, along with a reference frequency, producing a negative feedback loop. If the VCO output drifts, the error signal increases correspondingly, driving the PLL's output in the opposite direction so as to reduce the error. As such, the VCO output is said to be 'locked' to the frequency (or phase) of the reference input.

One conventional frequency synthesizer is an open-loop modulator. Open-loop modulators disable modulation just prior to a data transmission burst in order to allow a PLL component to stabilize. Once the PLL is stabilized, modulation is applied for a short time period. Open-loop modulators operate only in short bursts between tuning cycles. Further, the open-loop nature of the modulator results in a PLL free-running during bursts, thus increasing noise such as PLL phase error. In addition, the PLL conventionally requires precise calibration to ensure proper operation when used in an open-loop configuration.

Another conventional frequency synthesizer is a closed-loop modulator where the output of a VCO is fed back to an input of the synthesizer for minimizing the phase difference between the VCO output and a reference signal input. Some closed-loop frequency synthesizers perform frequency modulation by directly modulating the input of a VCO with a narrowband modulation signal. Frequency modulation is conventionally directly applied to the input of a VCO so long as the bandwidth of the modulation signal is less than the closed-loop bandwidth of the VCO, hence the term narrowband modulation. The closed-loop dynamics of a PLL do not appreciably distort modulation present in the VCO feedback signal so long as the modulation bandwidth is less than the closed-loop bandwidth of the PLL.

However, the closed-loop bandwidth of a PLL is fairly narrow in order to reduce noise such as PLL phase error, e.g., approximately 100 kHz or less in many practical applications. The closed-loop bandwidth of a PLL is mainly a function of the bandwidth of the PLL's loop filter, the current charge pump capacity of the PLL, and the divide ratio of the PLL's feedback path. Many modulation schemes use a modulation signal having a bandwidth greater than the closed-loop bandwidth of a PLL, where such modulation is referred to herein as wideband modulation. For example, wireless communication standards such as the IEEE 802.15 Bluetooth standard require modulation bandwidths greater than 100 kHz (e.g., the Bluetooth standard mandates a wideband modulation bandwidth of 500 kHz).

Signal distortion occurs when a wideband modulation signal is directly applied to a VCO, the output of which is feedback to an input of a closed-loop synthesizer. Distortion occurs when the feedback signal (including wideband modulation) is subjected to the closed-loop dynamics of a PLL. The closed-loop dynamics of a PLL attenuate the high frequency components of a wideband modulation signal and distort the modulation signal's group delay. Mainly, the limited bandwidth of the PLL's loop filter distorts the high-frequency modulation components when the VCO output is feedback to the PLL's phase comparator input.

One conventional approach for achieving wideband modulation using a closed-loop frequency synthesizer involves indirectly modulating the synthesizer's VCO. Instead of directly modulating the input of a VCO, the instantaneous divide value of a PLL's feedback path is altered responsive to a wideband modulation signal. Particularly, the nominal divide value associated with the PLL's feedback path sets the carrier frequency while instantaneous variations in the divide value cause modulation in the carrier frequency. Conventionally, a sigma-delta modulator generates a wideband modulation signal that alters the instantaneous divide value of the PLL's feedback path. As such, the wideband modulation signal is not removed from a synthesizer's feedback path. A pre-distortion filter alters the wideband modulation signal before it modulates the instantaneous divide value of a PLL's feedback path. The amplitude and group delay of the wideband modulation signal are pre-distorted so that the signal passes through the PLL without significant distortion. Ideally, the response of the pre-distortion filter is the inverse of the PLL's closed-loop response.

However, the complexity of the pre-distortion filter increases as the ratio of wideband modulation signal bandwidth to closed-loop bandwidth of the PLL increases. Further, the closed-loop dynamics of the PLL must be well-understood and accurately modeled to properly pre-distort the wideband modulation signal. The closed-loop dynamics of a PLL change as a function of fabrication process and operating parameter variation. As such, developing an accurate model of a PLL's closed loop dynamics becomes difficult when considering the wide range of process and operating parameters over which PLLs are expected to function properly.

Another conventional approach for achieving wideband modulation using a closed-loop frequency synthesizer involves injecting some components of a wideband modulation signal into one part of the synthesizer and other components into a different part of the synthesizer. Particularly, the high-frequency components directly modulate the input of a VCO and the low-frequency components alter the instantaneous divide value of the PLL's feedback path. However, equalization is needed to cancel overlap between the high and low frequency components. Otherwise, signal distortion arises. In addition, the conventional hybrid approach is adversely affected by the same operating condition variations that adversely affect operation of other conventional indirect wideband modulation schemes.

SUMMARY OF THE INVENTION

According to the methods and apparatus taught herein, one embodiment of modulating a signal by a frequency synthesizer comprises directly modulating a signal input to a voltage controlled oscillator (VCO) associated with the frequency synthesizer. The modulation signal has a bandwidth greater than a closed-loop bandwidth of the frequency synthesizer. The modulation signal is suppressed from a feedback path of the frequency synthesizer.

Of course, the present invention is not limited to the above features and advantages. Those skilled in the art will recognize additional features and advantages upon reading the following detailed description, and upon viewing the accompanying drawings.

DETAILED DESCRIPTION OF THE INVENTION

Figure 1:
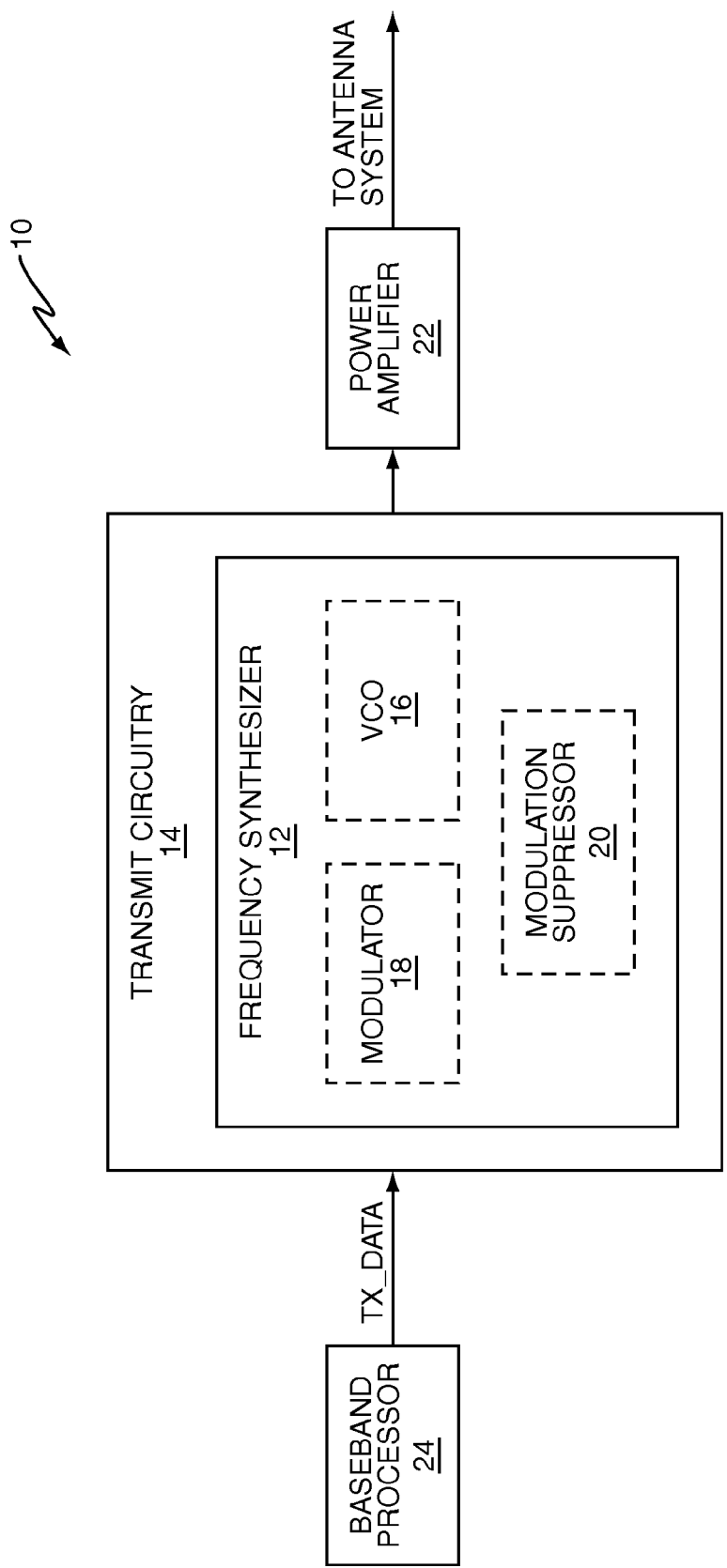
FIG. 1 is a block diagram of one embodiment of a wireless communication device including a frequency synthesizer.

FIG. 1 partially illustrates an embodiment of a wireless communication device 10 such as a portable phone, cellular phone, digital camera, portable computer, printer, audio player, etc. The wireless communication device 10 comprises a frequency synthesizer 12 included in or associated with transmit circuitry 14 for providing direct frequency modulation using a wideband modulation signal, i.e., a modulation signal having a bandwidth greater than the closed-loop bandwidth of the synthesizer 12. As such, the wireless communication device 10 may perform frequency modulation in accordance with a wireless communication protocol requiring signal modulation bandwidths greater than the closed-loop bandwidth of the frequency synthesizer 12, e.g., the IEEE 802.15 Bluetooth standard, Global System for Mobile communications (GSM) standard and IEEE 802.11b standard.

In more detail, the frequency synthesizer 12 has a Voltage Controlled Oscillator (VCO) 16 for generating an output signal that is in-phase with a reference signal input to the synthesizer 12. The output of the VCO 16 is fed back to another input of the synthesizer 12 in the form of a feedback signal. The synthesizer 12 compares the feedback signal and the reference signal to determine a phase or frequency difference between the two signals. Operation of the VCO 16 is adjusted by modifying a control signal input to the VCO 16, the control signal determining the VCO's operating frequency (or phase). Properly modifying the control signal input to the VCO 16 enables the VCO 16 to operate in-phase with the reference signal.

A modulator 18 included in or associated with the synthesizer 12 injects wideband frequency modulation directly into the VCO 16. In an embodiment, the control signal input to the VCO 16 is directly modulated with a wideband modulation signal. Accordingly, the VCO 16 not only operates in-phase with a reference signal, its output has frequency modulations corresponding to the wideband modulation signal. Since the wideband modulation signal is present in the VCO output signal, it is initially present in the feedback signal as well.

A modulation suppressor 20 included in or associated with the frequency synthesizer 12 suppresses the wideband modulation signal from the feedback signal. The term "suppress" as used herein means to reduce or eliminate. By suppressing the wideband modulation signal from the feedback signal, the synthesizer 12 determines the phase or frequency difference between the feedback signal and the reference signal absent appreciable contribution from the wideband modulation signal. As a result, the modulation suppressor 20 effectively prevents the closed-loop dynamics of the synthesizer 12 from adversely affecting the wideband frequency modulation operations of the synthesizer 12.

During operation, the wireless communication device 10 transmits (and receives) data via one or more wireless communication links (not shown). To that end, the transmit circuitry 14 prepares data (TX Data) for transmission, e.g., by encoding the data and/or modulating it. The modulator 18 uses the data to form a wideband modulation signal. The wideband modulation signal directly modulates the VCO 16, but is suppressed from the VCO feedback signal by the modulation suppressor 20. A power amplifier 22 amplifies the modulated output of the synthesizer 12, which may be optionally filtered prior to amplification. The amplified signal is provided to one or more antennae (not shown) for transmission. The wireless communication device 10 may include corresponding receive circuitry (not shown) for processing received signals, e.g., by demodulating and/or decoding them. The frequency synthesizer 12 may assist in received signal demodulation, e.g., by providing one or more timing reference signals to receive circuitry. A baseband processor 24 included in the device 10 performs various data processing tasks including providing data to the frequency synthesizer 12 for modulation and subsequent transmission.

Figure 2:
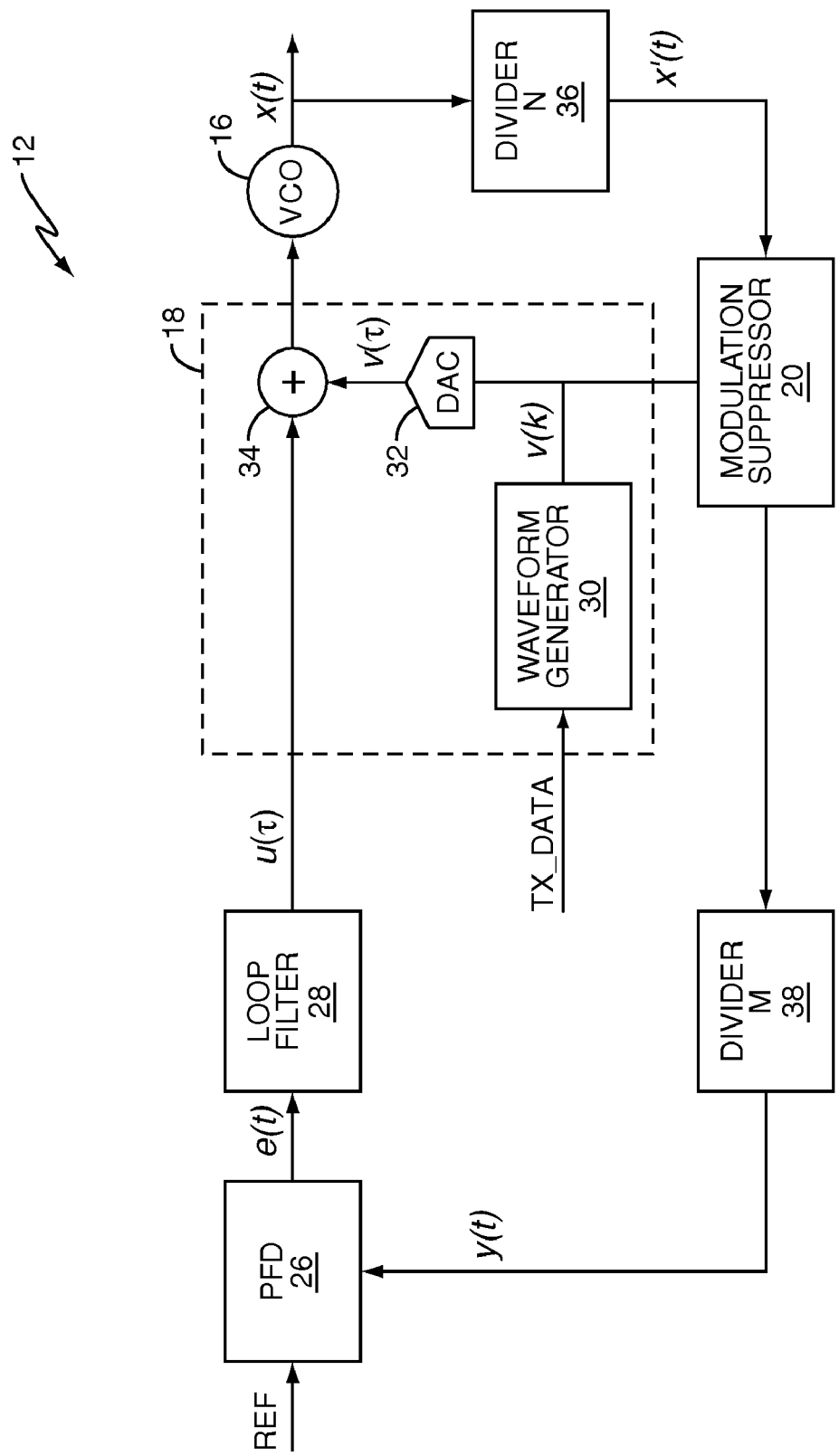
FIG. 2 is a block diagram of one embodiment of a frequency synthesizer.

FIG. 2 illustrates one embodiment of the frequency synthesizer 12. According to this embodiment, the synthesizer 12 comprises the modulator 18, a forward path including a phase-frequency detector 26, a loop filter 28 and the VCO 16, and a feedback path including the modulation suppressor 20. For ease of description only, some operational details of the frequency synthesizer 12 are described in the continuous (analog) time domain while other operational details are described in the discrete (digital) time domain. However, those skilled in the art will readily recognize that the synthesizer components may be analog, digital or some combination thereof, and thus, are not limited to any particular type or class of circuitry. As such, the frequency synthesizer 12 may comprise all analog components, all digital components, or a combination of both. Continuous waveform signals are represented herein with either the variable (t) or (τ) while discrete signals are represented with the variable (k).

The modulator 18 converts data (TX_DATA) received from the baseband processor 24 or other circuitry to a wideband modulation signal. In one embodiment, the modulator 18 comprises a waveform generator 30 for converting data to a discrete wideband modulation signal v(k). The modulator 18 may include a Digital-to-Analog Converter (DAC) 32 for converting v(k) to a continuous waveform wideband modulation signal v(τ). The modulator 18 further comprises circuitry such as an adder 34 or other comparable circuitry for modulating the VCO input with v(τ).

During operation, the phase-frequency detector 26 determines the phase (or frequency) difference between a reference signal (REF) input to the synthesizer 12 and a feedback signal y(t) propagated via the feedback path of the synthesizer 12. The reference signal sets the nominal or carrier frequency of the synthesizer 12 without modulation and the feedback signal y(t) represents the VCO output. The modulation suppressor 20 enables the phase-frequency detector 26 to compare y(t) with the reference signal absent appreciable contribution from the wideband modulation signal v(τ). Accordingly, the error signal e(t) output by the phase-frequency detector 26 represents the amount of phase (or frequency) difference between the VCO output and the reference signal. The loop filter 28 (and corresponding charge pump circuitry) converts e(t) into a control signal u(τ), the magnitude of which represents the phase (or frequency) difference between the VCO output and the reference signal. The control signal u(τ) output by the loop filter 28 is provided to the VCO 16 for adjusting VCO operation.

Figure 3:
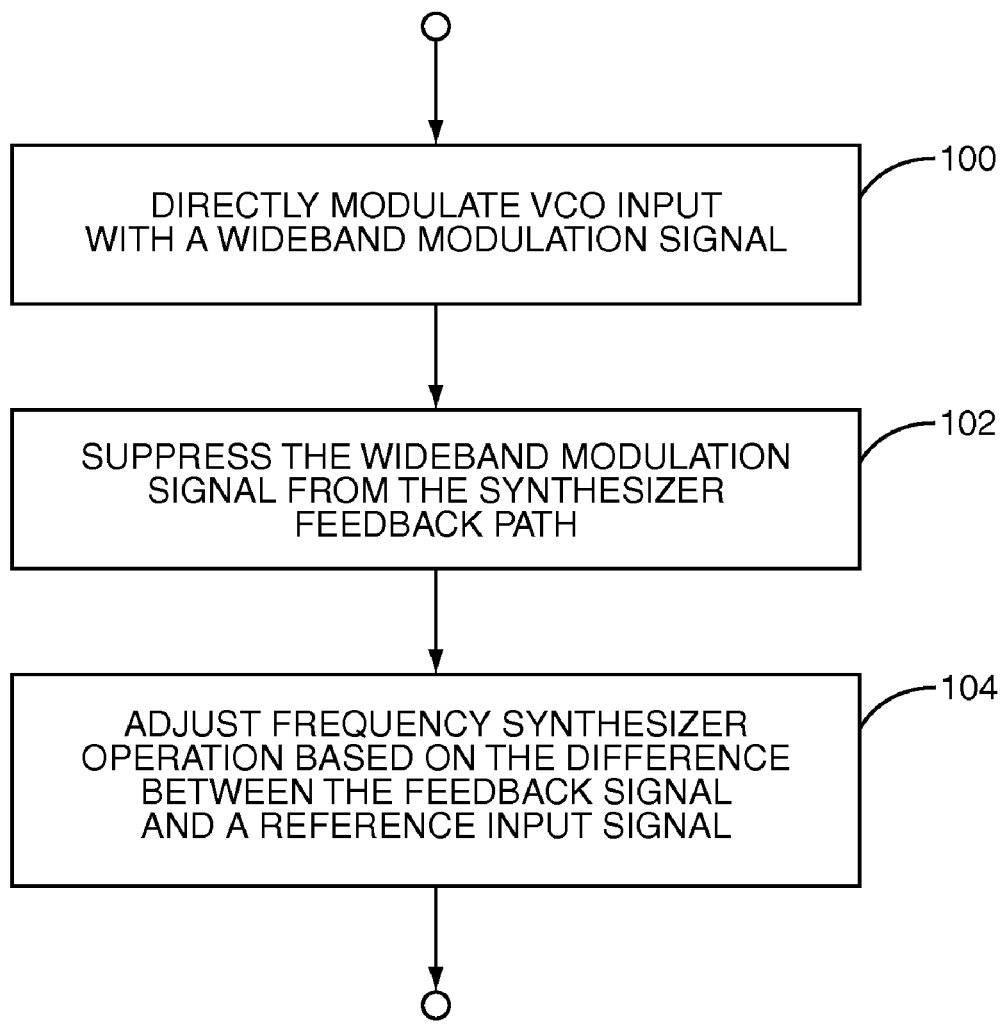
FIG. 3 is a logic flow diagram of one embodiment of program logic for modulating a signal by a frequency synthesizer.

The modulator 18 directly modulates the VCO control signal u(τ) with the continuous wideband modulation signal v(τ), e.g., as illustrated by Step 100 of FIG. 3. In one embodiment, the adder 34 combines v(τ) and u(τ). The VCO operates in-phase with the reference signal when the phase-frequency detector 26, in conjunction with the loop filter 28, reduces the error between the VCO output and the reference signal to an acceptable level (or below). As such, the VCO output is eventually synchronized with the reference signal and has modulations corresponding to the continuous wideband modulation signal v(τ). The output of the VCO 16 is generally given by:

$$x(t) = \cos\left(2\pi f_o t + \theta + 2\pi K_{VCO} \int_{-\infty}^{t} u(\tau) d\tau + 2\pi K_{VCO} \int_{-\infty}^{t} v(\tau) d\tau\right) \quad (1)$$

where $f_o$ is the nominal or carrier frequency of the VCO 16 without modulation, $\theta$ is the phase of the VCO 16, and $K_{VCO}$ is the frequency gain of the VCO 16.

The modulation suppressor 20 reduces or eliminates the wideband modulation signal v(τ) from the feedback signal y(t), e.g., as illustrated by Step 102 of FIG. 3. As such, the continuous wideband modulation signal v(τ) is subjected to only VCO 16 but not the closed-loop dynamics associated with the synthesizer 12. Particularly, v(τ) is not subjected to the closed-loop dynamics associated with the phase-frequency detector 26 and loop filter 28, both of which are designed to limit the bandwidth of the feedback system in order to reduce noise such as phase error, e.g., approximately 100 kHz or less. By suppressing modulation from the VCO's feedback path, v(τ) is not appreciably distorted by the closed-loop dynamics associated with the VCO's phase-frequency detector 26 and loop filter 28. Further, operation of the frequency synthesizer 12 is adjusted by comparing the feedback signal and the reference signal absent appreciable contribution from v(τ), e.g., as illustrated by Step 104 of FIG. 3.

Before wideband modulation is suppressed from the synthesizer's feedback path, the frequency of the feedback signal may be adjusted. To that end, one or more optional dividers 36 and 38 may be included in the feedback path for providing frequency syntheses. In one embodiment, a first divider 36 reduces the frequency of the VCO output x(t) before the modulation suppressor 20 reduces or eliminates wideband modulation, the divider output given by:

$$x'(t) = \cos\left(2\pi \frac{f_o}{N} t + \frac{\theta}{N} + 2\pi \frac{K_{VCO}}{N} \int_{-\infty}^{t} u(\tau) d\tau + 2\pi \frac{K_{VCO}}{N} \int_{-\infty}^{t} v(\tau) d\tau\right) \quad (2)$$

where N represents the frequency synthesis ratio associated with the first divider 36. A second divider 38 increases the frequency of the feedback signal y(t) after wideband modulation has been suppressed from the feedback path. One or both of the dividers 36 and 38 may comprise a fractional-N divider for providing non-integer frequency synthesis. Regardless of the frequency synthesis techniques deployed in the feedback path, the modulation suppressor 20 uses an instance of the wideband modulation signal v(k) to suppress frequency modulation from the feedback path.

Figure 4:
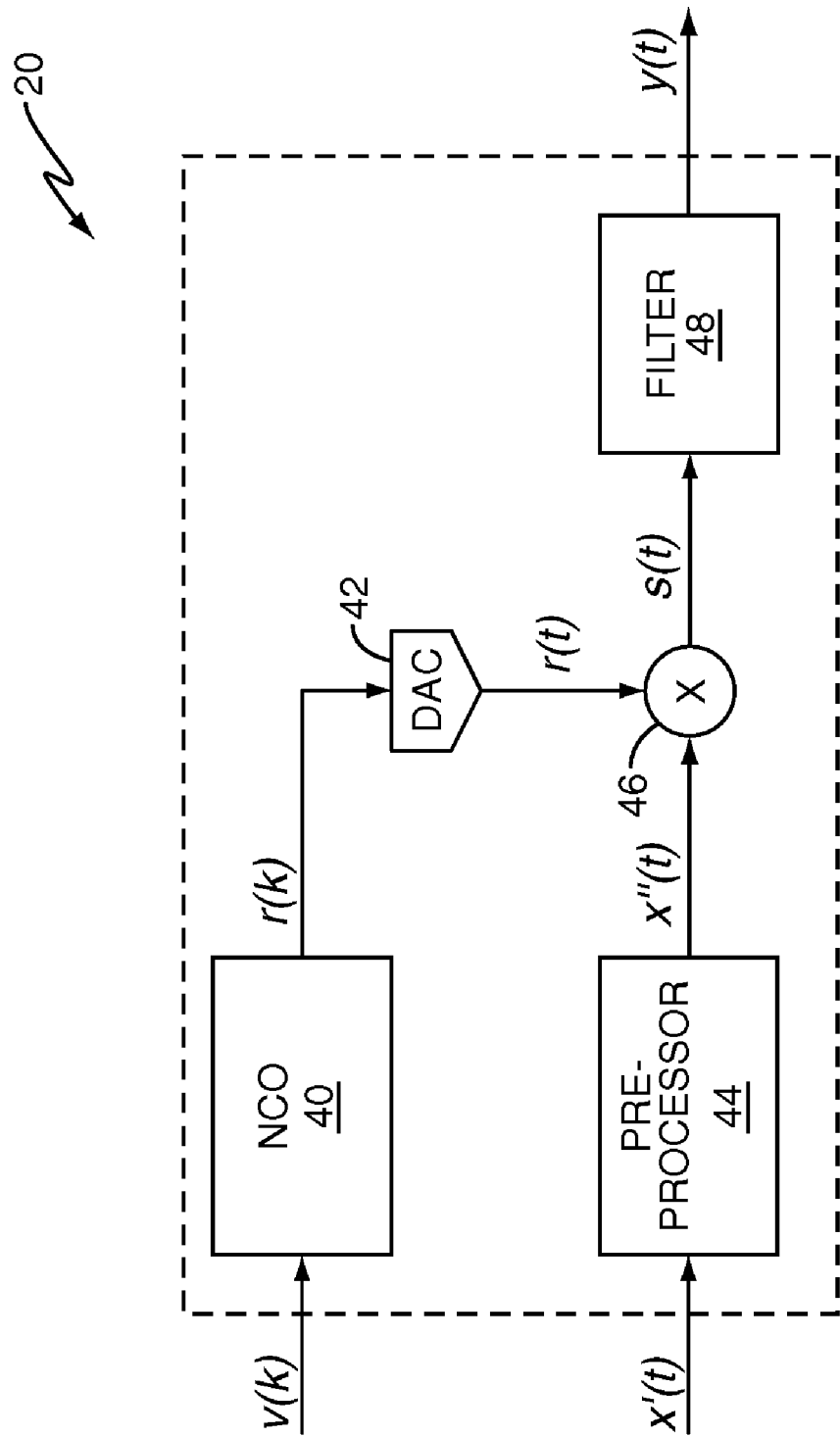
FIG. 4 is a block diagram of one embodiment of a modulation suppressor included in or associated with the frequency synthesizer of FIG. 2.

FIG. 4 illustrates one embodiment of the modulation suppressor 20 included in or associated with the frequency synthesizer 12. According to this embodiment, the modulation suppressor 20 comprises a Numerically Controlled Oscillator (NCO) 40. The NCO 40 converts the discrete wideband modulation signal v(k) to a periodic version of the modulation signal, e.g., as given by:

$$r(k) = \cos\left(2\pi f_1 t + 2\pi \frac{\hat{K}_{VCO}}{N} T_S \sum_{i=0}^{k} v_i + \phi\right) \quad (3)$$

where $f_1$ is a selected frequency greater than zero, $\hat{K}_{VCO}$ is the estimated frequency gain of the VCO 16, $\phi$ is unknown phase, $T_S$ is the sampling period, and $v_i$ represents discrete samples of the wideband modulation signal v(k). For ease of description only, $\hat{K}_{VCO}$ may be approximated as the actual frequency gain of the VCO 16. Selection of the frequency $f_1$ forms the basis for suppressing frequency modulation from the feedback path as will be described shortly. A Digital-to-Analog Converter (DAC) 42 included in or associated with the modulation suppressor 20 converts r(k) to its analog equivalent as given by:

$$r(t) = \cos\left(2\pi f_1 t + \phi + 2\pi \frac{\hat{K}_{VCO}}{N} \int_{-\infty}^{t} v(\tau) d\tau\right) \quad (4)$$

Before wideband modulation is suppressed from the feedback path, a pre-processor 44 such as a low pass or band pass filter suppresses harmonics from the VCO output x(t) (or divider output x'(t)) such as the kind that may result from frequency synthesis. A mixer 46 or other suitable circuitry then combines the filtered VCO output x"(t) and the DAC output r(t) to form a signal s(t) having at least two periodic components as given by:

$$s(t) = \frac{1}{2}\cos\left[2\pi\left(\frac{f_o}{N} + f_1\right)t + \frac{\theta}{N} + \phi + 2\pi \frac{K_{VCO}}{N} \int_{-\infty}^{t} u(\tau) d\tau + 4\pi \frac{K_{VCO}}{N} \int_{-\infty}^{t} v(\tau) d\tau\right] + \frac{1}{2}\cos\left[2\pi\left(\frac{f_o}{N} - f_1\right)t + \frac{\theta}{N} - \phi + 2\pi \frac{K_{VCO}}{N} \int_{-\infty}^{t} u(\tau) d\tau\right] \quad (5)$$

Since both x''(t) and r(t) are periodic, two main periodic components result when the two signals are multiplied as given by the trigonometric identity:

$$\cos(A+B)*\cos(B)=\cos(A+2B)+\cos(A) \quad (6)$$

where cos(A+B) corresponds to x''(t) and cos(B) corresponds to r(t). The mixer 46 thus produces a signal s(t) having a first main component including a term corresponding to the wideband modulation signal v(τ) and a second main component substantially devoid of a term corresponding to v(τ). Those skilled in the art will readily recognize that the imperfect nature of one or more of the circuits included in or associated with the synthesizer 12 may result in some frequency modulation contribution being present in the second component of the mixer output s(t). Accordingly, "substantially devoid" as used herein means an undesired signal contribution is sufficiently small so as to not adversely affect operation of the synthesizer 12.

Additionally, the first and second components of the mixer output s(t) have a frequency offset. The frequency offset corresponds to the frequency $f_1$ of the periodic modulation signal r(k) as selected by the NCO 40. In more detail, the frequency offset between the first and second components of s(t) arises when the filtered VCO output signal x''(t) is multiplied with the DAC output r(t) as given by equation (5). Accordingly, the mixer output s(t) has a high frequency component:

$$\left(\frac{f_o}{N} + f_1\right)$$

and a low frequency component $$\left(\frac{f_o}{N} - f_1\right).$$

The modulation suppressor 20 makes use of the frequency offset between the first and second components of s(t) to suppress the wideband modulation signal v(τ) from the synthesizer's feedback path.

To that end, the mixer output s(t) is passed through a filter 48 such as a bandpass or low pass filter. The filter 48 is tuned so that the component having wideband modulation contribution is suppressed while the component substantially devoid of wideband modulation contribution is passed relatively un-attenuated. Accordingly, the frequency response of the filter 48 is based on the frequency $f_1$ associated with the periodic modulation signal r(k). For illustrative purposes only, the filter 48 passes the low frequency component of equation (5) while suppressing the high frequency component. Proper selection of $f_1$ and design of filter 48 ensures sufficient suppression of wideband modulation from the feedback signal y(t).

Figure 5:
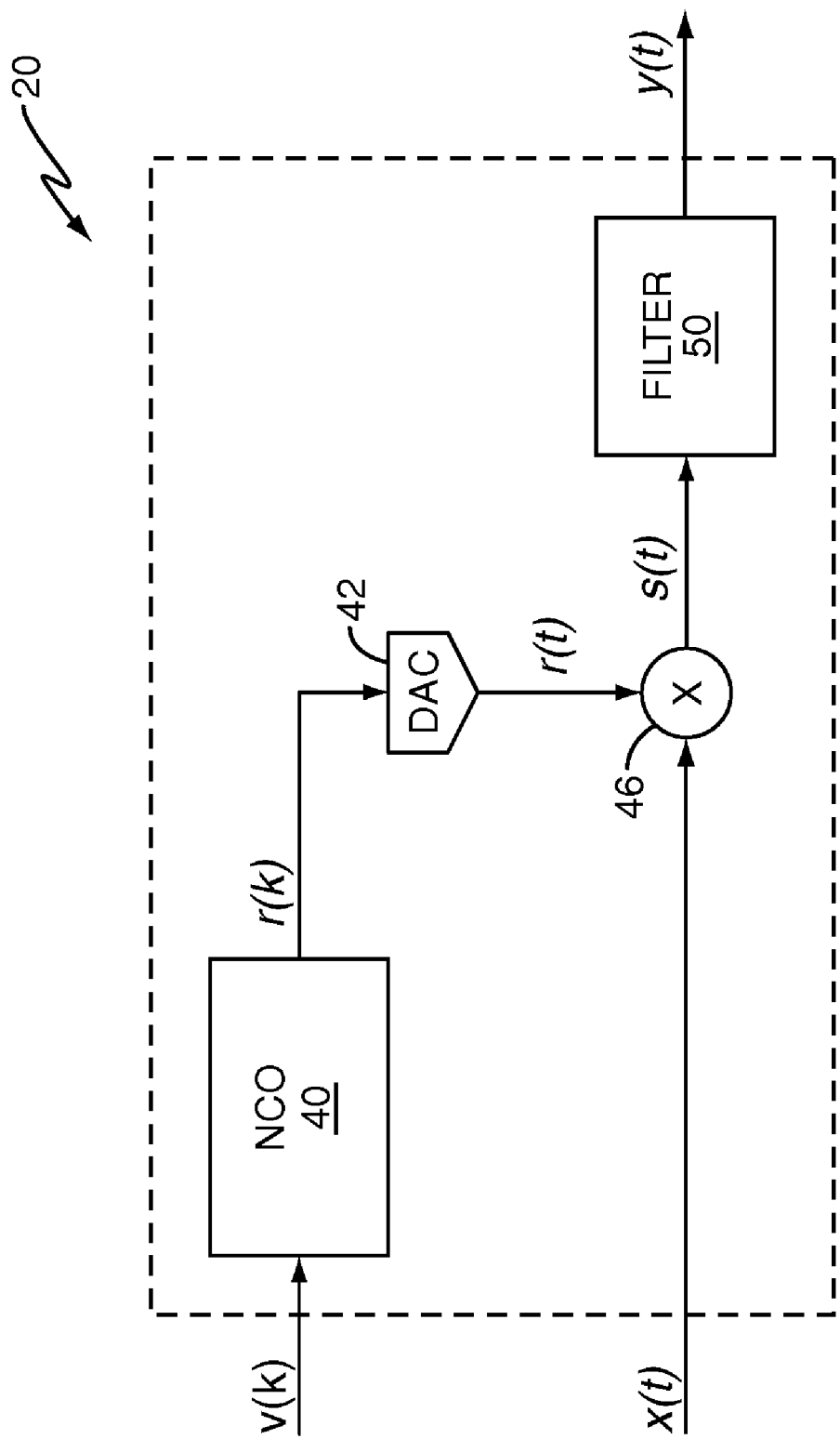
FIG. 5 is a block diagram of another embodiment of a modulation suppressor included in or associated with the frequency synthesizer of FIG. 2.

FIG. 5 illustrates another embodiment of the modulation suppressor 20. According to this embodiment, the NCO 40 generates a periodic signal r(k) as given by equation (3) and the DAC 42 converts the NCO output to an analog equivalent r(t) as given by equation (4). The VCO output x(t) is not filtered before the mixer 46 combines x(t) with the DAC output r(t), e.g., when the VCO's output frequency is not adjusted by the first divider 36 of FIG. 2. According to this embodiment, the mixer 46 is further configured to switch the polarity of the signal r(t) output by the DAC 42. The mixer output is given by:

$$s(t) = \frac{1}{2}\cos\left[2\pi(f_o + f_1)t + \theta + \phi + 2\pi K_{VCO}\int_{-\infty}^{t} u(\tau)d\tau + 4\pi K_{VCO}\int_{-\infty}^{t} v(\tau)d\tau\right] + \frac{1}{2}\cos\left[2\pi(f_o - f_1)t + \theta - \phi + 2\pi K_{VCO}\int_{-\infty}^{t} u(\tau)d\tau\right] \quad (7)$$

A filter 50 such as a bandpass or low pass filter removes the component of s(t) having wideband modulation contribution while passing the component substantially devoid of such contribution as previously described.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of modulating a signal by a frequency synthesizer, comprising:
    directly modulating a signal input to a voltage controlled oscillator (VCO) associated with the frequency synthesizer with a modulation signal having a bandwidth greater than a closed-loop bandwidth of the frequency synthesizer;
    suppressing the modulation signal from a signal output by the VCO to form a feedback signal;
    providing the feedback signal to an input of the frequency synthesizer;
    decreasing a frequency of the signal output by the VCO before suppressing the modulation signal; and
    suppressing one or more harmonics of the signal output by the VCO after decreasing the frequency of the signal and before suppressing the modulation signal.

2. The method of claim 1, wherein directly modulating the signal input to the VCO with the modulation signal comprises:
    converting data to a wideband modulation signal; and
    combining the wideband modulation signal and an output of a loop filter associated with the frequency synthesizer.

3. The method of claim 1, wherein suppressing the modulation signal from a signal output by the VCO to form a feedback signal comprises:
    combining a periodic version of the modulation signal and the signal output by the VCO to form a composite signal, the composite signal comprising:
        a first component having signal contribution associated with the modulation signal;
        a second component substantially devoid of signal contribution associated with the modulation signal; and
        wherein the first and second components are offset in frequency, the frequency offset corresponding to a frequency of the periodic version of the modulation signal; and
    suppressing the first component from the composite signal based on the frequency offset between the first and second components.

4. A method of modulating a signal by a frequency synthesizer, comprising:

directly modulating a signal input to a voltage controlled oscillator (VCO) associated with the frequency synthesizer with a modulation signal having a bandwidth greater than a closed-loop bandwidth of the frequency synthesizer;

suppressing the modulation signal from a signal output by the VCO to form a feedback signal;

providing the feedback signal to an input of the frequency synthesizer;

decreasing a frequency of the signal output by the VCO before suppressing the modulation signal; and increasing the frequency of the feedback signal after suppressing the modulation signal.

5. The method of claim 4, wherein directly modulating the signal input to the VCO with the modulation signal comprises:

converting data to a wideband modulation signal; and combining the wideband modulation signal and an output of a loop filter associated with the frequency synthesizer.

6. The method of claim 4, wherein suppressing the modulation signal from a signal output by the VCO to form a feedback signal comprises:

combining a periodic version of the modulation signal and the signal output by the VCO to form a composite signal, the composite signal comprising:

a first component having signal contribution associated with the modulation signal;

a second component substantially devoid of signal contribution associated with the modulation signal; and wherein the first and second components are offset in frequency, the frequency offset corresponding to a frequency of the periodic version of the modulation signal; and suppressing the first component from the composite signal based on the frequency offset between the first and second components.

7. A frequency synthesizer, comprising:

a voltage controlled oscillator (VCO) configured to output a signal corresponding to a phase or frequency difference between a feedback signal and a reference signal;

a modulator configured to directly modulate a signal input to the VCO with a modulation signal having a bandwidth greater than a closed-loop bandwidth of the frequency synthesizer;

a modulation suppressor configured to suppress the modulation signal from the feedback signal, the modulation suppressor comprising:

a numerically controlled oscillator (NCO) configured to generate a periodic version of the modulation signal having a selected frequency;

a mixer configured to combine the periodic version of the modulation signal and the signal output by the VCO to form a composite signal, the composite signal comprising:

a first component having signal contribution associated with the modulation signal;

a second component substantially devoid of signal contribution associated with the modulation signal; and wherein the first and second components have a frequency offset corresponding to the selected frequency of the periodic version of the modulation signal; and a filter configured to suppress the first component from the composite signal based on the frequency offset between the first and second components;

a frequency divider configured to decrease a frequency of the feedback signal before the modulation suppressor suppresses the modulation signal; and wherein the filter is configured to suppress one or more harmonics of the feedback signal after the feedback signal passes through the frequency divider and before the modulation suppressor suppresses the modulation signal.

8. The frequency synthesizer of claim 7, further comprising:

a phase-frequency detector configured to determine the phase or frequency difference between the feedback signal and the reference signal; and a loop filter configured to generate a control signal for input to the VCO based on an output of the phase-frequency detector.

9. The frequency synthesizer of claim 8, wherein the modulator comprises:

a waveform generator configured to convert data to a wideband modulation signal; and an adder configured to combine the wideband modulation signal and the control signal generated by the loop filter.

10. The frequency synthesizer of claim 7, further comprising a second frequency divider configured to increase the frequency of the feedback signal after the modulation suppressor suppresses the modulation signal.

11. The frequency synthesizer of claim 7, wherein the modulation signal is a wideband modulation signal.

12. The frequency synthesizer of claim 7, wherein the frequency synthesizer is digital.

13. A wireless communication device including the frequency synthesizer as claimed in claim 7.

14. The wireless communication device of claim 13, wherein the wireless communication device further includes circuitry configured to process signals based on the signal output by the frequency synthesizer.

15. A frequency synthesizer, comprising:

a voltage controlled oscillator (VCO) configured to output a signal corresponding to a phase or frequency difference between a feedback signal and a reference signal;

a modulator configured to directly modulate a signal input to the VCO with a modulation signal having a bandwidth greater than a closed-loop bandwidth of the frequency synthesizer;

a modulation suppressor configured to suppress the modulation signal from the feedback signal;

a frequency divider configured to decrease a frequency of the feedback signal before the modulation suppressor suppresses the modulation signal; and a filter configured to suppress one or more harmonics of the feedback signal after the feedback signal passes through the frequency divider and before the modulation suppressor suppresses the modulation signal.

16. The frequency synthesizer of claim 15, further comprising:

a phase-frequency detector configured to determine the phase or frequency difference between the feedback signal and the reference signal; and a loop filter configured to generate a control signal for input to the VCO based on an output of the phase-frequency detector.

17. The frequency synthesizer of claim 16, wherein the modulator comprises:

a waveform generator configured to convert data to a wideband modulation signal; and an adder configured to combine the wideband modulation signal and the control signal generated by the loop filter.

18. The frequency synthesizer of claim 15, wherein the frequency synthesizer is digital.

19. A wireless communication device including the frequency synthesizer as claimed in claim 15.

20. A frequency synthesizer, comprising:

a voltage controlled oscillator (VCO) configured to output a signal corresponding to a phase or frequency difference between a feedback signal and a reference signal;

a modulator configured to directly modulate a signal input to the VCO with a modulation signal having a bandwidth greater than a closed-loop bandwidth of the frequency synthesizer;

a modulation suppressor configured to suppress the modulation signal from the feedback signal;

a first frequency divider configured to decrease a frequency of the feedback signal before the modulation suppressor suppresses the modulation signal; and a second frequency divider configured to increase the frequency of the feedback signal after the modulation suppressor suppresses the modulation signal.

21. The frequency synthesizer of claim 20, further comprising:

a phase-frequency detector configured to determine the phase or frequency difference between the feedback signal and the reference signal; and a loop filter configured to generate a control signal for input to the VCO based on an output of the phase-frequency detector.

22. The frequency synthesizer of claim 21, wherein the modulator comprises:

a waveform generator configured to convert data to a wideband modulation signal; and an adder configured to combine the wideband modulation signal and the control signal generated by the loop filter.

23. The frequency synthesizer of claim 20, wherein the frequency synthesizer is digital.

24. A wireless communication device including the frequency synthesizer as claimed in claim 20.

* * * * *